United States Patent
Yin et al.

(10) Patent No.: US 8,242,559 B2
(45) Date of Patent: Aug. 14, 2012

(54) INTEGRATED CIRCUIT SYSTEM WITH A FLOATING DIELECTRIC REGION AND METHOD OF MANUFACTURE THEREOF

(75) Inventors: Chunshan Yin, Singapore (SG); Lee Wee Teo, Singapore (SG); Chung Foong Tan, Singapore (SG); Jae Gon Lee, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 284 days.

(21) Appl. No.: 12/422,694

(22) Filed: Apr. 13, 2009

(65) Prior Publication Data

US 2010/0258868 A1 Oct. 14, 2010

(51) Int. Cl.
*H01L 27/01* (2006.01)
*H01L 27/12* (2006.01)
*H01L 31/0392* (2006.01)

(52) U.S. Cl. .......... 257/347; 257/623; 257/E27.112
(58) Field of Classification Search .......... 257/347, 257/623
See application file for complete search history.

(56) References Cited

U.S. PATENT DOCUMENTS

| 6,521,949 B2 | 2/2003 | Assaderaghi et al. |
| 7,422,950 B2 | 9/2008 | Curello et al. |
| 2006/0081928 A1* | 4/2006 | Ko et al. ............. 257/347 |

* cited by examiner

*Primary Examiner* — Thien F Tran

(57) ABSTRACT

A method of manufacture of an integrated circuit system includes: providing a second layer between a first layer and a third layer; forming an active device over the third layer; forming the third layer to form an island region underneath the active device; forming the second layer to form a floating second layer with an undercut beneath the island region; and depositing a fourth layer around the island region and the floating second layer.

10 Claims, 3 Drawing Sheets

INTEGRATED CIRCUIT SYSTEM WITH A FLOATING DIELECTRIC REGION AND METHOD OF MANUFACTURE THEREOF

TECHNICAL FIELD

The present invention relates generally to an integrated circuit system, and more particularly to an integrated circuit system with a floating dielectric region.

BACKGROUND ART

Integrated circuits find application in many of today's consumer electronics, such as cell phones, video cameras, portable music players, printers, computers, etc. Integrated circuits may include a combination of active devices, passive devices and their interconnections.

Active devices are typically comprised by metal-oxide-semiconductor field-effect transistor (MOSFET) devices, which generally include a semiconductor substrate, having a source, a drain, and a channel located between the source and drain. A gate stack composed of a conductive material (i.e., a gate) and an oxide layer (i.e., a gate oxide) are typically located directly above the channel. During operation, an inversion layer forms a conducting bridge or "channel" between the source and drain when a voltage is applied to the gate. Both p-channel and n-channel MOSFET technologies are available and can be combined on a single substrate in one technology, called complementary-metal-oxide-semiconductor or CMOS.

Scaling of CMOS configurations has become a major challenge for the semiconductor industry. To obtain high performance and consistent operation of these CMOS structures, a form of vertical device isolation has been developed to help control latchup and parasitic capacitance problems, which are common for these structures. This form of vertical device isolation is commonly referred to as silicon-on-insulator (SOI). SOI technology is based on an insulator layer (typically an oxide) that has been buried within a silicon substrate, thereby effectively electrically isolating any devices formed on the upper silicon surface. However, SOI type devices are not without their own problems, as they are commonly plagued by self-heating and external series resistance problems that can degrade the performance of these devices.

Thus, a need still remains for a reliable integrated circuit system and method of fabrication, wherein the integrated circuit system exhibits a reduction in self-heating, a lower external series resistance, improved short channel effect control, and/or a reduction in sidewall junction capacitance under a gate. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing a second layer between a first layer and a third layer; forming an active device over the third layer; forming the third layer to form an island region underneath the active device; forming the second layer to form a floating second layer with an undercut beneath the island region; and depositing a fourth layer around the island region and the floating second layer.

The present invention provides an integrated circuit system including: a substrate including a first layer; a floating second layer with an undercut over the first layer; an island region over the floating second layer; an active device over the island region; and a fourth layer around the island region and the floating second layer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
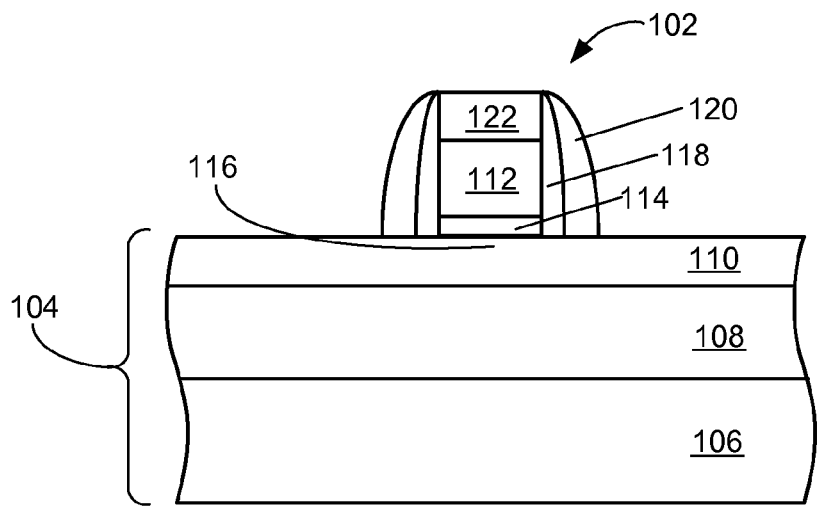
FIG. 1 is a partial cross sectional view of an integrated circuit system in an initial stage of manufacture in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first", "second", "third", and "fourth" as used herein are for purposes of differentiation between elements only and are not to be construed as limiting the scope of the present invention.

The term "layer" encompasses both the singular and the plural unless otherwise indicated.

The term "active device" is used herein to mean a fully functioning and operable device that can increase the magnitude of a given electrical input parameter by merely establishing electrical contacts.

Generally, the following embodiments relate to the formation of an integrated circuit system including, but not limited to, an active device structure, such as an NFET, PFET, and/or CMOS device, with a strategically engineered buried insulator region that helps to control self-heating, external series resistance, short channel effects, and/or sidewall junction capacitance under a gate.

FIGS. 1-8, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-8. Moreover, it is to be understood that many modifications, additions, and/or omissions may be made to the below described process without departing from the scope of the claimed subject matter. For example, the below described process may include more, fewer, or other steps. Additionally, steps may be performed in any suitable order without departing from the scope of the present invention.

Moreover, it is to be appreciated that the integrated circuit system of the present disclosure may include any number of multi-electrode devices (e.g., active device structures) in which the current flowing between two specified electrodes is controlled or modulated by the voltage applied at a control electrode. Exemplary illustrations may include an n-channel field effect transistor (NFET), a p-channel field effect transistor (PFET), a complementary metal-oxide-silicon (CMOS) configuration, a single-gate transistor, a multi-gate transistor, a fin-FET, or an annular gate transistor.

Moreover, it will be appreciated by those skilled in the art that the techniques of the present embodiments can be used to fabricate an integrated circuit system, for example, an active device, using existing conventional NFET, PFET, and CMOS compatible process technology, thereby minimizing or reducing the cost of manufacturing.

Furthermore, it is to be understood that one or more of the integrated circuit system could be prepared at one time on a medium, which could be separated into individual or multiple integrated circuit assemblies at a later stage of fabrication.

It should be understood that the definitions and nomenclature used herein are given by way of example only and that one skilled in the art would readily understand that other definitions and nomenclature may be used to illustrate the techniques, systems, devices, and methods described herein.

Referring now to FIG. 1, therein is shown a partial cross sectional view of an integrated circuit system 100 in an initial stage of manufacture in accordance with an embodiment of the present invention. In some embodiments, the integrated circuit system 100 may include an active device 102. In such cases, the active device 102 may more particularly include NFET devices, PFET devices and/or a combination thereof (i.e., CMOS devices), for example. However, it is to be understood that the active device 102 is not limited to the preceding examples and may include any number of multi-electrode devices in which the current flowing between two specified electrodes is controlled or modulated by the voltage applied at a control electrode. Accordingly, although the embodiments described herein are presented as for forming a single active device structure, the methods may be used to form multiple active device structures.

For example, it will be appreciated by those skilled in the art that although the present embodiments are generally depicted with respect to a single device structure, it is to be understood that the system and methods described herein are applicable to one or more NFET active device structures, one or more PFET active device structures, and/or one or more of a combination of NFET active device structures and PFET active device structures that may be cooperatively connected together to function as one or more CMOS structures.

Moreover, it is to be understood that the integrated circuit system 100 manufactured by the embodiments described herein can be used within processor components, memory components, logic components, digital components, analog components, mixed-signal components, power components, radio-frequency (RF) components (e.g., RF CMOS circuits), digital signal processor components, micro-electromechanical components, optical sensor components, and so forth, in numerous configurations and arrangements as may be needed.

In some embodiments, the active device 102 can be formed over, on and/or within a substrate 104 by conventional deposition, patterning, photolithography, and etching techniques known in the semiconductor processing industry for the manufacture of active devices. Generally, the substrate 104 may include a first layer 106, a second layer 108, and a third layer 110. In such cases, the first layer 106 and the third layer 110 may include any semiconducting material, such as, Si, SiC, SiGe, Si/SiGe, SiGeC, Ge, GaAs, InAs, InP, other III/V or II/VI compound semiconductors. Additionally, the first layer 106 and the third layer 110 may also include doped and undoped configurations, epitaxial layers, strained configurations, and one or more crystal orientations (e.g., <100>, <110>, and/or <111> orientations), which may be strategically employed to optimize carrier mobility within NFET and/or PFET devices.

In at least one embodiment, the second layer 108 can be formed on the first layer 106 and the third layer 110 can be formed on the second layer 108.

The third layer 110 is preferably a thin layer and, in some embodiments, may possess a thickness of about one hundred (100) nanometers or less, for example. Accordingly, the substrate 104 may possess a thickness ranging from about several hundred nanometers to about several hundred microns, for example.

Generally, the second layer 108 may include an insulating material and can be referred to as a buried layer because it is positioned between the first layer 106, which can be referred to as a bulk layer, and the third layer, which can be referred to as a thin layer. By way of example, the second layer 108 may include an oxide, such as silicon dioxide. However, it is to be understood that other insulating materials commonly known within the art, and not repeated herein, can be used.

As an exemplary illustration, in at least one embodiment, the substrate 104 can be formed by a SIMOX (Separation by IMplanted OXygen) process or by a SmartCut process. Moreover, it will be appreciated by those skilled in the art that the substrate 104 may also include a fully depleted SOI type structure.

However, the examples provided for the substrate 104 are not to be construed as limiting and the composition of the substrate 104 may include any material, configuration, or thickness that physically and electrically enables the formation of active and/or passive device structures.

In general, the active device 102 may include a gate 112, a gate dielectric 114, a channel 116, a first spacer 118, a second spacer 120, and a gate cap 122.

In some embodiments, the gate 112 may be formed from conventional materials including doped and undoped semiconducting materials (such as, for example, polysi, amorphous Si, or SiGe), a metal, a metallic alloy, a silicide, a metal nitride, a metal oxide, a carbon nanotube, or a combination thereof. By way of example, if the gate 112 includes a metal, the metal may include copper, tungsten, aluminum, aluminum alloy, palladium, titanium, tantalum, nickel, cobalt, and molybdenum. Furthermore, by way of example, if the gate 112 includes a metal silicide, the metal silicide may include copper silicide, tungsten silicide, aluminum silicide, palladium silicide, titanium silicide, tantalum silicide, nickel silicide, cobalt silicide, erbium silicide, and molybdenum silicide. In accordance with the scope of the present embodiments, other materials, which may be known to those skilled in the art for gate structures, may also be used for the gate 112.

Generally, the gate 112 can be formed by chemical vapor deposition (CVD), physical vapor deposition (PVD), silicidation, plating, and/or atomic layer deposition (ALD). The gate 112 may also include a multilayer structure and/or a dual structure including different gate heights for PFET and NFET devices, and/or different materials for NFET and PFET devices.

The gate dielectric 114 may be made from materials including, but not limited to, silicon oxide, silicon oxynitride, silicon nitride, a silicon oxide/nitride/oxide stack, a high-k dielectric material (i.e., one having a dielectric constant value greater than silicon oxide), or a combination thereof. However, it is to be understood that the type of material chosen for the gate dielectric 114 is not limited to the preceding examples; for example, the gate dielectric 114 may include any material that permits induction of a charge in the channel 116 when an appropriate voltage is applied to the gate 112. In accordance with the scope of the present embodiments, other materials, which may be known to those skilled in the art for gate structures, may also be used for the gate dielectric 114.

The gate dielectric 114 can be formed by thermal oxide, ALD, CVD, or PVD. The gate dielectric 114 may also include a multilayer structure and/or different materials for NFET and PFET devices. In at least one embodiment, the gate dielectric 114 may include a multi-layer structure, such as a first layer of an oxide and a second layer of a high-k material.

It will be appreciated by those skilled in the art that the thickness of the gate 112 and the gate dielectric 114 can vary with the design specifications and/or the current technology process node (e.g., 45 nm, 32 nm, etc.) for the active device 102.

The first spacer 118 may include dielectric materials such as an oxide, a nitride, or a combination thereof, but preferably includes silicon dioxide. The first spacer 118 can be formed by a variety of techniques, including, but not limited to, physical vapor deposition, chemical vapor deposition and thermal oxidation, followed by an appropriate anisotropic etch.

The second spacer 120 can be formed adjacent the first spacer 118 and typically includes a material (e.g., an oxide, a nitride, or a combination thereof) that can be selectively etched with respect to the material of the first spacer 118. For example, if the first spacer 118 is formed using silicon dioxide, the second spacer 120 can be formed using silicon nitride. For such a spacer material composition, a plurality of anisotropic etch recipes with moderately high etch selectivity are well known within the art. The second spacer 120 can be formed by a variety of techniques, including, but not limited to, chemical vapor deposition and physical vapor deposition, followed by an appropriate anisotropic etch. In at least one embodiment the second spacer 120 may include a silicon nitride material.

In other embodiments, the first spacer 118 and/or the second spacer 120 may also include any type of stress-inducing material that transfers its inherent or intrinsic stress to the gate 112, the channel 116, a source and drain extension region, and/or a source and drain region. In such cases, the stress-inducing material may include a compressive/tensile stressed memorization material, a compressive stressed material, and/or a tensile stressed material. By way of example, when the first spacer 118 and/or the second spacer 120 include the characteristics of a stress memorization layer, the first spacer 118 and/or the second spacer 120 can transfer their intrinsic stress to the active device 102 upon recrystallization of amorphous regions within the active device 102 and/or areas around the active device 102. Generally, such techniques permit the first spacer 118 and/or the second spacer 120 to impart a compressive stress or a tensile stress upon the channel 116, thereby enhancing the amount of current that can flow through the device.

However, it is to be understood that the type of materials chosen for the first spacer 118 and the second spacer 120 are not limited to the above examples and may include any material that permits a moderately high etch selectivity between the first spacer 118 and the second spacer 120, electrical isolation of the gate 112, selective etching of the substrate 104, introduction of a stress to the channel 116, and/or formation of a lateral dopant profile within the material adjacent the channel 116.

Moreover, it is to be understood that the thickness and/or width of each of the first spacer 118 and the second spacer 120 may determine, at least in part, the location of a subsequently formed source and drain region, the location of a low resistance electrical contact, the dimensions of an island region 202 (of FIG. 2), the dimensions of a floating second layer 400 (of FIG. 4), and/or the proximity of a subsequently deposited stressor layer to the channel 116. Accordingly, the thickness and/or width of each of the first spacer 118 and the second spacer 120 can be modulated to meet the particular design specifications desired for the integrated circuit system 100.

Generally, the first spacer 118 and/or the second spacer 120 may include a thickness ranging from about 20 angstroms to about 2000 angstroms. However, it is to be understood that the thickness of the first spacer 118 and/or the second spacer 120 may vary with the design specifications of the device. For example, the thickness of the first spacer 118 and/or the second spacer 120 may vary with the desired size and/or dimensions of the island region 202 and/or the floating second layer 400 underneath the channel 116, and their resultant effects upon series resistance reduction, short channel effect control, and/or reduction of sidewall junction capacitance under the gate 112.

Furthermore, it will be appreciated by those skilled in the art that although the spacer structure is depicted as a combination of the first spacer 118 and the second spacer 120, it is to be understood that the spacer structure can be formed by one or more spacers.

The active device 102 may also include the gate cap 122, such as a nitride or an oxynitride cap that can be formed over the gate 112, thereby helping to protect the gate 112 during subsequent processing steps.

It will be appreciated by those skilled in the art that an isolation structure (not shown), which may include a shallow trench isolation structure, a local oxidation of silicon structure, and/or other suitable isolation features, can be formed adjacent the active device 102 to electrically isolate and/or separate the active device 102 from other devices. In some embodiments, the isolation structure can be made from a dielectric material such as silicon oxide, silicon nitride, or silicon oxynitride. In other embodiments, the isolation structure may also include a multi-layer structure of one or more dielectric materials.

Figure 2:
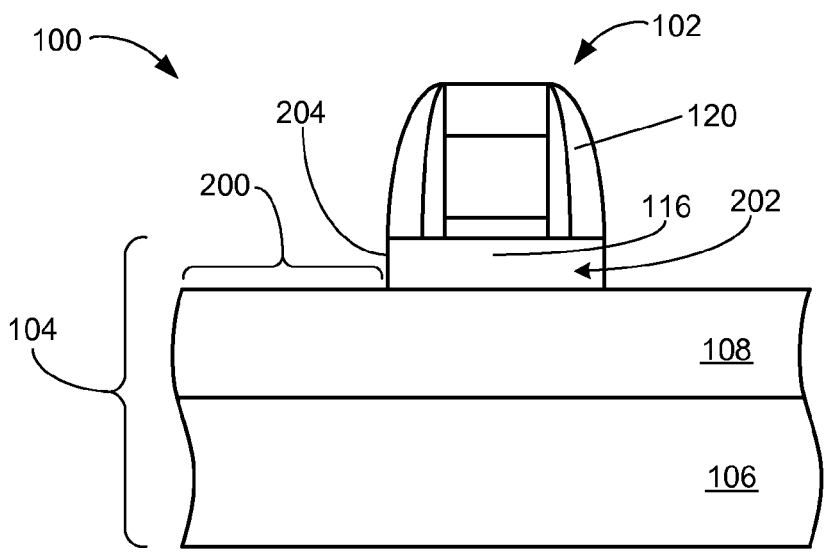
FIG. 2 is the structure of FIG. 1 after processing a third layer.

Referring now to FIG. 2, therein is shown the structure of FIG. 1 after processing the third layer 110, of FIG. 1. Generally, the third layer 110 can be removed from the regions adjacent the second spacer 120, commonly referred to as a source/drain region 200, thereby exposing a portion of the second layer 108 not covered by the active device 102 for subsequent processing. In such cases, the portion of the third layer 110 removed from over the second layer 108 can be aligned to the second spacer 120, thereby leaving a portion of the third layer 110 underneath the active device 102. This remaining portion of the third layer 110 underneath the active device 102 can be called the island region 202. It will be appreciated by those skilled in the art that the island region 202 can function as the channel 116 of the active device 102.

Generally, the size and/or dimensions of the island region 202 are substantially equal to the size and/or dimensions of the active device 102. Stated another way, the boundaries of the island region 202 can be defined by the footprint of the active device 102 adjacent the island region 202. In at least one embodiment, a sidewall 204 of the island region 202 can be substantially coplanar with the base portion of the second spacer 120 adjacent the island region 202. However, it is to be understood that the size and/or dimensions of the island region 202 can be larger or smaller than the size and/or dimensions of the active device 102 depending upon the design specifications of the integrated circuit system 100. For example, the size and/or dimensions of the island region 202 can be manipulated to cover source and drain extension regions and/or at least part of deeply doped source and drain regions, thereby helping to reduce the series resistance of the active device 102.

It will be appreciated by those skilled in the art that by forming the active device 102 per the methods and systems disclosed herein that subsequently formed source and drain extension regions can be made thicker than the island region 202 or the channel 116 (thereby helping to reduce series resistance) and subsequently formed deeply doped source and drain regions can be connected to a bulk layer (e.g., the first layer 106) of the substrate 104 to create a thermal conduction path.

In general, the third layer 110 can be etched using a process that is selective to the second layer 108. In at least one embodiment, the third layer 110 can be etched using an anisotropic process, such as reactive ion etching (RIE), to form the island region 202. It will be appreciated by those skilled in the art that such an anisotropic etching process will help to prevent undercutting of the island region, and thereby, form the sidewall 204 in a vertical orientation that is substantially perpendicular to the major surface of the second layer 108. It will also be appreciated by those skilled in the art that by forming the sidewall 204 with a vertical orientation that is substantially perpendicular to the major surface of the second layer 108, a subsequent isotropic etching of the second layer 108 can be better controlled.

However, it is to be understood that the etching process employed to form the island region 202 may include any etching process (e.g., wet or dry) that permits selective removal of the third layer 110 while minimizing any detrimental etching effects upon the active device 102, the second layer 108, and/or the sidewall 204 of the island region 202.

Figure 3:
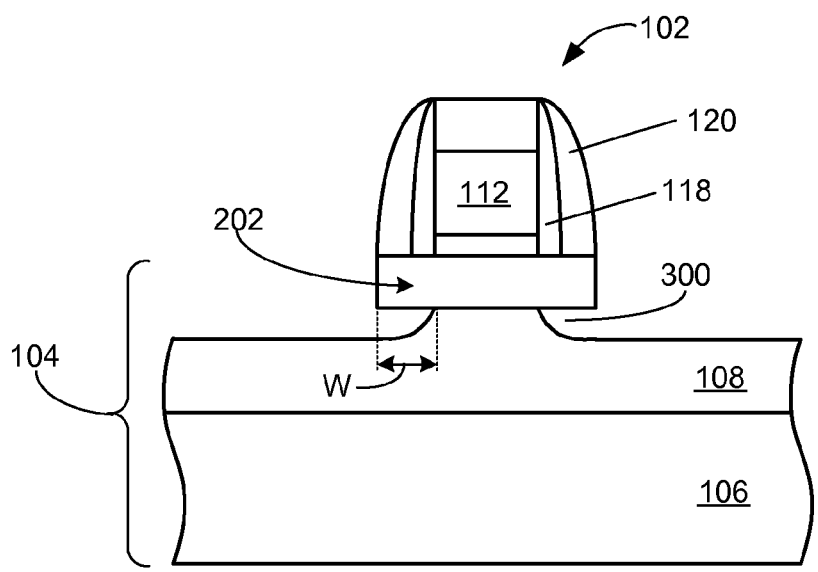
FIG. 3 is the structure of FIG. 2 after processing a second layer to form an undercut.

Referring now to FIG. 3, therein is shown the structure of FIG. 2 after processing the second layer 108 to form an undercut 300. In general, the second layer 108 is processed to form the undercut 300 adjacent and below the island region 202 on both sides, while leaving remaining portions of the second layer 108 formed over the first layer 106. In at least one embodiment, the undercut 300 can be described as quarter circle configuration of void space formed underneath the island region 202 within the second layer 108. In other embodiments, the undercut 300 can be described as quarter circle configuration of void space that directly contacts the island region 202, thereby removing all insulating material between the island region 202 and the undercut 300. Generally, the undercut 300 occurs along the top surface of the second layer 108 adjacent the island region 202. However, it is to be understood that the shape of the undercut 300 and/or the direct contact of the undercut 300 with the island region 202 is not essential, what is important is that the undercut 300 form a void space underneath the island region 202 that can be filled with a subsequent material that will alter the electrical properties of the active device 102.

In at least one embodiment, the undercut 300 can be formed by employing an isotropic etching process that removes an amount not to exceed a width dimension W from underneath the island region 202. Per the present embodiment, the width dimension W can be defined as the combined width of the first spacer 118 and the second spacer 120 at their interface with the island region 202. By way of example, the undercut 300 can be formed by employing an isotropic etching process that removes an amount between about five percent (5%) and about ninety five percent (95%) of the width dimension W. In a preferred embodiment, the undercut 300 can remove an amount substantially equivalent to the width dimension W.

In another embodiment, the undercut 300 can be formed by employing an isotropic etching process that removes a predetermined amount of material (e.g., in a thickness and width direction) that will not affect the ability of the second layer 108 to be strategically designed to optimize, control and/or alter the series resistance, the short channel effects, and/or the sidewall junction capacitance under the gate 112 of the active device 102.

However, it is to be understood that the amount of material removed from underneath the island region 202 is not essential, what is important is that the undercut 300 remove enough material from underneath the island region 202 to form a void space that can be subsequently filled with a different material that will alter the electrical properties of the active device 102.

The present inventors have discovered that by forming the undercut 300 within the second layer 108 that the external series resistance of the active device 102 can be reduced. It will be appreciated by those skilled in the art that upon filling the undercut 300 with an appropriate material that a subsequently formed source and drain extension region and/or a source and drain region can be formed thicker/deeper than a source and drain extension region and/or a source and drain region can be formed without the undercut 300, thereby reducing series resistance. Stated another way, the undercut 300 permits the source and drain extension region and/or the source and drain region to be formed in a portion of the substrate 104 that is thicker/deeper than just the island region 202.

By enlarging the volume available for a subsequently formed source and drain extension region and/or a subsequently formed source and drain region (e.g., by removing material from the second layer 108 to form the undercut 300), the resistance of these structures can be reduced. Without the undercut 300, previous source and drain extension regions and/or source and drain regions were confined to the thickness of the island region 202, which due to its ultra thin profile/thickness typically possessed a higher resistance relative to a thicker layer.

Furthermore, the present inventors also believe that the undercut 300 can help to disrupt the formation of a depletion layer that can increase the junction capacitance and the sidewall junction capacitance under the gate 112.

It will be appreciated by those skilled in the art that the undercut 300 can be formed by an isotropic etching process that is selective to the material of the third layer 110. However, it is to be understood that the type of etch process employed to form the undercut 300 within the second layer 108 is not critical. What is important is that the selected etch process provides a method for forming a void space underneath the active device 102 that can be subsequently filled with a different material that can alter the capacitance and electrical resistance of the active device 102.

Figure 4:
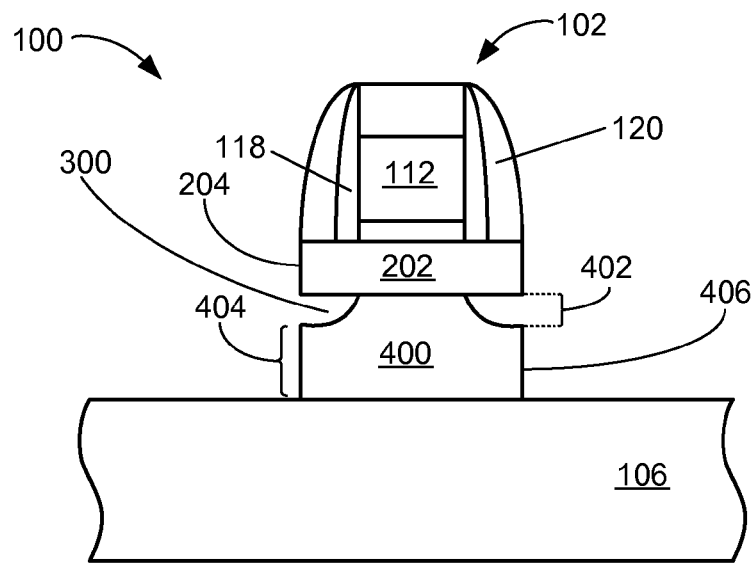
FIG. 4 is the structure of FIG. 3 after further processing of a second layer to form a floating second layer.

Referring now to FIG. 4, therein is shown the structure of FIG. 3 after further processing of the second layer 108, of FIG. 3, to form the floating second layer 400. Generally, the floating second layer 400 may now include a floating first region 402 and a floating second region 404. The floating second layer 400 is defined as a floating layer because all portions of the second layer 108 are removed from over the first layer 106 except for the portion (e.g., the floating second layer 400) underneath the active device 102.

In at least one embodiment, the remainder of the second layer 108 can be removed from the regions adjacent the second spacer 120, commonly referred to as the source/drain region 200 (of FIG. 2), thereby exposing a portion of the first layer 106 not covered by the active device 102 and the floating second layer 400 for subsequent processing. In such cases, the portion of the second layer 108 removed from over the first layer 106 can be aligned to the second spacer 120, thereby forming the floating second region 404 of the floating second layer 400 underneath the active device 102. It will be appreciated by those skilled in the art that the floating second layer 400 can help to reduce latchup, parasitic capacitance, unwanted electric fields, and hot carrier effects within the active device 102.

Generally, the size and/or dimensions of the floating second region 404 are substantially equal to the size and/or dimensions of the active device 102 and/or the island region 202. In at least one embodiment, a sidewall 406 of the floating second region 404 can be substantially coplanar with the base portion of the second spacer 120 at the base of the active device 102 and/or the sidewall 204. However, it is to be understood that the size and/or dimensions of the floating second region 404 can be larger or smaller than the size and/or dimensions of the active device 102 depending upon the design specifications of the integrated circuit system 100.

In general, the floating second region 404 can be formed by etching the second layer 108 via a process that is selective to material of the first layer 106. In at least one embodiment, the floating second region 404 can be formed by etching the second layer 108 via an anisotropic process, such as a reactive ion etch (RIE) process. It will be appreciated by those skilled in the art that such an anisotropic etching process will help to prevent further undercutting of the floating first region 402, and thereby, form the sidewall 406 in a vertical orientation that is substantially perpendicular to the major surface of the first layer 106. However, it is to be understood that the etching process employed to form the floating second layer 400 may include any etching process (e.g., wet or dry) that permits selective removal of the second layer 108 while minimizing any detrimental etching effects upon the active device 102, the first layer 106, the island region 202, the undercut 300, and/or the sidewall 406 of the floating second region 404. Furthermore, it is to be understood that the size of the area exposed on the first layer 106 can be further controlled by varying the thickness dimensions of the first spacer 118 and the second spacer 120.

The present inventors have discovered that by forming the floating second layer 400 that short channel effects (SCE) common to current processing technology nodes can be controlled and/or reduced. Not wishing to be limited to any particular theory, the present inventors believe that the floating second layer 400 helps to reduce the electric fields within the active device 102 that can increase the likelihood of hot carrier effects. Moreover, the methods, structures, and systems disclosed herein can help to eliminate deeply doped source/drain punch through issues (e.g., due to the floating second layer 400), while providing enhanced control of extension junction profiles by forming the undercut 300. In some embodiments, the SCE control of the methods, structures, and systems disclosed herein are substantially similar to that of fully depleted SOI devices.

The present inventors have also discovered that by forming the floating second layer 400 that junction capacitance between the gate 112 and other structures can be reduced. For example, by forming the undercut 300, the sidewall junction capacitance under the gate 112 can be limited because the thickness of the device channel can be very small (e.g., about tens of nanometers or less). Furthermore, the junction capacitance of the active device 102 can also be minimized by introducing gradually doped source/drain regions. Gradually doped source/drain regions are possible because the floating second layer 400 helps to eliminate source/drain punch through issues. Moreover, the present inventors also believe that the floating second layer 400 helps to disrupt the formation of a depletion layer that can increase the junction capacitance and/or the sidewall junction capacitance under the gate 112.

Figure 5:
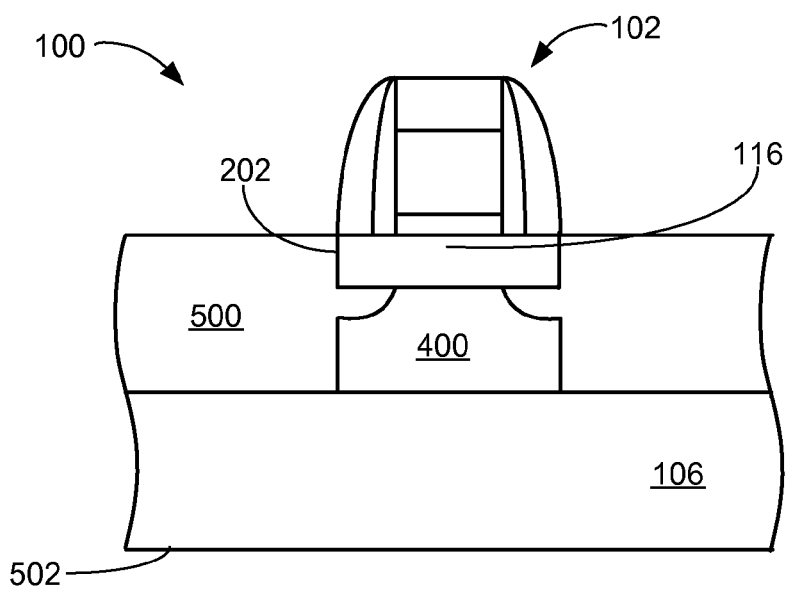
FIG. 5 is the structure of FIG. 4 after forming a fourth layer around an island region and a floating second layer.

Referring now to FIG. 5, therein is shown the structure of FIG. 4 after forming a fourth layer 500 around and/or on the island region 202 and the floating second layer 400. Generally, the fourth layer 500 can be deposited or epitaxially grown (e.g., via a selective epitaxial growth process) on or over exposed portions of the first layer 106. In at least one embodiment, the fourth layer 500 may include any material that permits thermal conduction and/or electrical conduction by itself or upon doping. In other embodiments, the fourth layer 500 may include any material with a lattice constant value that exceeds the lattice constant value of the material of the first layer 106, thereby permitting a stress inducing effect to occur upon the channel 116.

By way of example, the fourth layer 500 can be made from a deposited silicon-germanium (SiGe) layer or an epitaxially grown SiGe layer if the active device 102 is a PFET device. In such cases, a germanium form (e.g., a SiGe layer) of the fourth layer 500 may include a germanium content ranging from about five percent (5%) to about one-hundred percent (100%). It will be appreciated by those skilled in the art that stress imparted by the fourth layer 500 upon the channel 116 can be strategically modulated by varying the concentration of germanium.

By way of another example, the fourth layer 500 can be made from an epitaxial silicon or an epitaxial silicon carbide (SiC) if the active device 102 is an NFET device. By way of example, a SiC form of the fourth layer 500 may include a carbon content ranging from about one percent (1%) to about three percent (3%).

It will be appreciated by those skilled in the art that by employing an epitaxial process for depositing the fourth layer 500, the fourth layer 500 may obtain a crystalline structure that is substantially identical to the crystalline orientation of the first layer 106 (e.g., a <100>, <110>, or <111> orientation).

It will be appreciated by those skilled in the art that a CMOS configuration of the active device 102 may include both embodiments (e.g., epitaxial SiGe and Si) of the fourth layer 500 to optimize the individual performance of each NFET and PFET device.

Moreover, it will be appreciated by those skilled in the art that the fourth layer 500 can be optionally doped in-situ during deposition or epitaxial growth with either a p-type dopant for a PFET device or an n-type dopant for an NFET device.

However, it is to be understood that the fourth layer 500 need not be limited to any particular type of material or concentration. In accordance with the present embodiments, the fourth layer 500 may include any material and/or composition with thermal conductance, electrical conductance, and/or a lattice constant value that exceeds the lattice constant value of the first layer 106. Additionally, the fourth layer 500 may also include one or more layers with different lattice constant values, so long as the combined lattice constant value of the one or more layers exceeds that of the first layer 106.

Furthermore, it is to be understood that a multitude of deposition parameters, such as reactant flow rates, pressure, temperature, reactant materials, and thickness, can be adjusted to modulate the stress within the fourth layer 500. Moreover, it will be appreciated by those skilled in the art that the above parameters are not limiting and that additional parameters may also be employed and/or manipulated to effectuate the purpose of forming the fourth layer 500 with a specified internal stress that will increase the performance of the active device 102 by enhancing the carrier mobility within the channel 116.

Generally, the fourth layer 500 can be deposited, grown, or formed to the original height of the substrate 104, of FIG. 1, thereby surrounding the channel 116 with a stress inducing effect. However, it is to be understood that larger or smaller thicknesses of the fourth layer 500 may be used depending upon the desired stress inducing effects and/or the design specifications of the integrated circuit system 100. By way of example, the thickness of the fourth layer 500 deposited or epitaxially grown may include any thickness that permits electrical conductivity without detrimental breakdown during operation of the active device 102. Moreover, it will be appreciated by those skilled in the art that the fourth layer 500 may extend beyond the plane established by the top surface of the substrate 104, of FIG. 1, thereby further enhancing the stress inducing effect upon the channel 116.

Additionally, it is to be understood that the selective epitaxy process of the present embodiments provides flexibility for the device designer to optimize performance of the integrated circuit system 100 by controlling epilayer doping, thickness, concentration, and profile, thereby optimizing the stress inducing effect upon the channel 116 by the fourth layer 500.

The present inventors have discovered that by forming the fourth layer 500 to surround the exposed portions of the island region 202 and the floating second layer 400 that a conduction path for self-heating can be provided that was previously blocked by unetched buried oxide (BOX) layers, thereby helping to eliminate self-heating problem common to prior SOI devices. It will be appreciated by those skilled in the art that an unetched BOX layer can impede the mobility of carriers (e.g., thermally and electrically) to the bulk substrate, thereby increasing the thermal resistance of the active device 102, which can lead to self-heating.

By forming the floating second layer 400 and the fourth layer 500 pursuant to the present embodiments, a conductive path can be created that was previously blocked by the second layer 108, of FIG. 1. As such, the thermal resistance of the active device 102 can be lowered, thereby effectively minimizing the self-heating effect common to prior SOI structures. This thermal conduction path (e.g., from the channel 116 to the fourth layer 500 and then to the first layer 106) for heat dissipation can be further enhanced by forming a heat sink (not shown) on a bottom surface 502 of the first layer 106.

It will be appreciated by those skilled in the art that by forming the fourth layer 500, the typical thin SOI layer of prior SOI devices has been eliminated. As such, the present embodiments eliminate the increased electrical resistance that is common to these thin SOI layers. Accordingly, the electrical resistance of the active device 102 can also be decreased by forming the fourth layer 500 because it provides a larger conductive area or volume.

Figure 6:
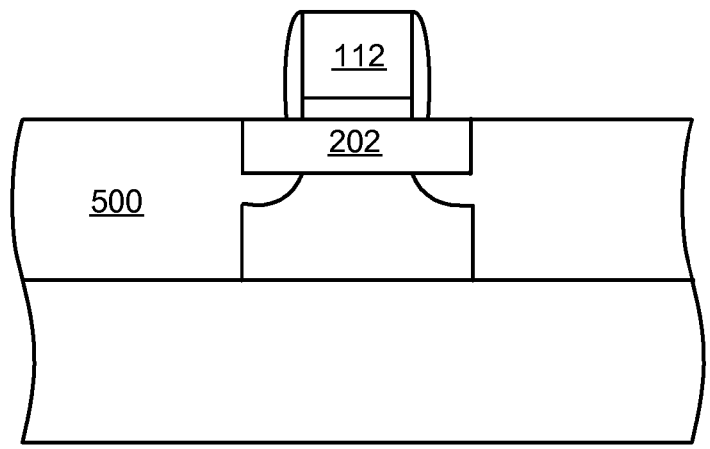
FIG. 6 is the structure of FIG. 5 after removal of a second spacer and a gate cap.

Referring now to FIG. 6, therein is shown the structure of FIG. 5 after removal of the second spacer 120, of FIG. 5, and the gate cap 122, of FIG. 5. It will be appreciated by those skilled in the art that the removal of the second spacer 120 and the gate cap 122 exposes portions of the gate 112, the island region 202, and the fourth layer 500 for subsequent processing. By way of example, the removal of the second spacer 120 may permit an easing of process latitudes for forming a subsequent source and drain extension implant.

In some embodiments, the etch process utilized to remove the second spacer 120 and the gate cap 122 can be performed by a variety of etching techniques, including, but not limited to, wet or dry etch process etch techniques, single step etch processes, and/or multiple step etch processes. However, it is to be understood that the type of etch process selected to remove the second spacer 120 and the gate cap 122 is not critical, what is important is that the selected etch process removes the second spacer 120 and the gate cap 122 without appreciable damage occurring to the gate 112, the island region 202, and/or the fourth layer 500.

Figure 7:
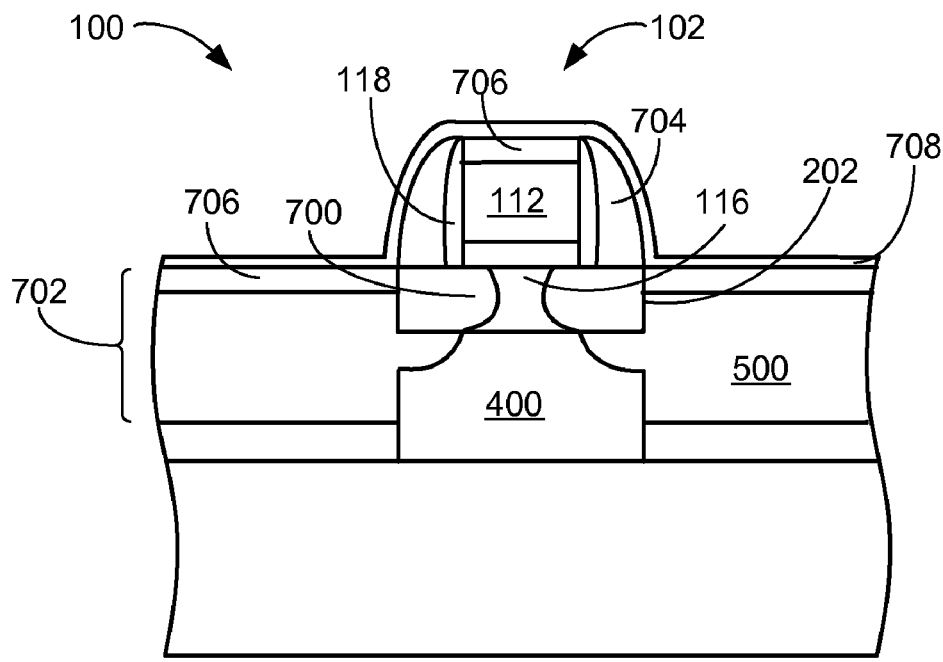
FIG. 7 is the structure of FIG. 6 after subsequent processing steps.

Referring now to FIG. 7, therein is shown the structure of FIG. 6 after subsequent processing steps. In general, a source/drain extension 700 may be formed to a shallow depth with a low concentration of impurities relative to a source/drain 702. In at least one embodiment, the source/drain extension 700 can be formed within the fourth layer 500 and within the island region 202. It will be appreciated by those skilled in the art that the source/drain extension 700 may help to reduce detrimental electric field strengths and their concomitant effects upon hot carriers/electrons, and gate threshold voltages.

Generally, the source/drain extension 700 can be formed from a dopant implant dose between about $1\times10^{14}$ ions/cm$^2$ to about $2.5\times10^{15}$ ions/cm$^2$. However, larger or smaller doses may be used depending upon the impurity used and the design specifications of the active device 102. Moreover, it is to be understood that the above parameters are not limiting and those skilled in the art will appreciate that additional parameters may also be employed/manipulated to effectuate the purpose of implanting a highly-doped and abrupt form of the source/drain extension 700.

The impurities used to form the source/drain extension 700 may include n-type or p-type, depending on the active device 102 being formed (e.g., n-type impurities for an NFET device and p-type impurities for a PFET device). Typically, the impurities used to form the source/drain extension 700 are of the same conductivity type as the impurities used to form the source/drain 702. It is to be understood that the source/drain extension 700 can be formed via an angled or perpendicular implant, with respect to the surface of the fourth layer 500.

The active device 102 may also include an optional halo implant. As is known in the art, a halo implant can help to increase the effective length of the channel 116, which may be advantageous for minimizing punchthrough current and short channel effects, thereby improving the performance of the active device 102. In general, a halo region can be formed by implanting impurities adjacent the source/drain extension 700 and the channel 116. In some embodiments, the halo region can be formed by implanting the fourth layer 500 and the island region 202 with impurities of opposite conductivity type to that of the impurities used to form the source/drain 702 and the source/drain extension 700. For example, if the source/drain 702 and the source/drain extension 700 are formed with n-type impurities then the optional halo region can be formed with p-type impurities.

Subsequent to forming the source/drain extension 700 and the optional halo implant, a third spacer 704 can be formed adjacent the first spacer 118. The third spacer 704 may typically include a material (e.g., an oxide, a nitride, a stress inducing material, or a combination thereof) that can be selectively etched with respect to the material of the first spacer 118. For example, if the first spacer 118 is formed using silicon dioxide, the third spacer 704 can be formed using silicon nitride. For such a spacer material composition, a plurality of anisotropic etch recipes with moderately high etch selectivity are well know within the art. The third spacer 704 can be formed by a variety of techniques, including, but not limited to, chemical vapor deposition and physical vapor deposition, followed by an appropriate anisotropic etch. In at least one embodiment the third spacer 704 may include a silicon nitride material.

Subsequent to forming the third spacer 704, the source/drain 702 can be formed within the fourth layer 500. In some embodiments the source/drain 702 can be aligned to the third spacer 704. In general, the source/drain 702 may be formed with an implantation energy between about 1 keV and about 70 keV and a dose between about $1\times10^4$ ions/cm$^2$ to about $3\times10^{15}$ ions/cm$^2$. However, larger or smaller energies and doses may be used depending upon the impurity used and the design specifications of the active device 102. It is to be understood that the impurities used to form the source/drain 702 may be n-type or p-type, depending on the device being formed (e.g., n-type impurities for an NFET device and p-type impurities for a PFET device). Moreover, since the floating second layer 400 helps to eliminate source/drain punch through issues, the source/drain 702 junction profile can be optimized to minimize junction capacitance.

It will be appreciated by those skilled in the art that the implant energy used to form the source/drain extension 700, the optional halo region, and/or the source/drain 702 may possess sufficient energy to amorphize at least a portion of the gate 112, the island region 202, and/or the fourth layer 500. An implant with sufficient energy to amorphize at least a portion of the gate 112, the island region 202, and/or the fourth layer 500 allows a subsequent anneal step to transfer/memorize a stress to the gate 112, the island region 202, and to the fourth layer 500 during recrystallization from a stress memorization transfer layer, thereby promoting stress within the channel 116 and improving the performance of the integrated circuit system 100.

Generally, the integrated circuit system 100 may also include an electrical contact 706, such as a low resistance silicide or salicide electrical contact, formed over the gate 112 and the source/drain 702. In some embodiments, the electrical contact 706 may include any conducting compound that forms an electrical interface between itself and another material that is thermally stable and provides uniform electrical properties with low resistance. In other embodiments, the electrical contact 706 may include refractory metal materials such as, tantalum (Ta), cobalt (Co), titanium (Ti), tungsten (W), platinum (Pt), or molybdenum (Mo). In yet other embodiments, the electrical contact 706 formed over the source/drain 702 can be aligned to the third spacer 704 via a salicide process.

It will be appreciated by those skilled in the art that the electrical contact 706 can affect the mobility of carriers (e.g., due to stresses imparted by the electrical contact 706) within the channel 116 of the active device 102. For example, in cases where the active device 102 includes a PFET device, if the electrical contact 706 is placed too close to the channel 116, the electrical contact 706 can detrimentally affect the mobility of carriers within the channel 116. As such, it is to be understood that the thickness of the first spacer 118 and the third spacer 704 can be modulated (e.g., by increasing the thickness) to reduce or negate the detrimental effect that the electrical contact 706 can have on carrier mobility within the channel 116 of the active device 102.

Alternatively, the thickness of the first spacer 118 and the third spacer 704 can also be modulated (e.g., by decreasing the thickness) to enhance the effect that the electrical contact 706 can have on carrier mobility within the channel 116 if the active device 102 is an NFET device. Accordingly, the thickness of the first spacer 118 and the third spacer 704 can be modulated to enhance or reduce the effects that the electrical contact 706 could have on the stress level within the active device 102.

Furthermore, it is to be understood that the integrated circuit system 100 may undergo a cleaning step to remove surface contaminants, such as particles, mobile ionic contaminants, organics and native oxides, before formation of the electrical contact 706.

Additionally, it will be appreciated by those skilled in the art that other stress engineered layers can be deposited over the integrated circuit system 100 for purposes of exerting additional stresses upon each of the channel 116. In such cases, the additional stress engineered layers can be strategically designed and deposited to exert compressive and/or tensile stresses, depending upon the type of device (e.g., tensile for NFET and compressive for PFET).

For example, the stress engineered layers may include a dielectric layer 708. The dielectric layer 708 can be deposited over the active device 102 and may be engineered to promote a compressive and/or tensile strain within the channel 116 of the active device 102. By way of example, the dielectric layer 708 may include a silicon nitride layer deposited by a plasma enhanced chemical vapor deposition process. In such cases, it is to be understood that a multitude of deposition parameters, such as reactant flow rates, pressure, temperature, RF power and frequency, reactant materials, and thickness, can be adjusted to modulate the compressive and/or tensile stress within the dielectric layer 708. Moreover, it will be appreciated by those skilled in the art that the above parameters are not limiting and that additional parameters may also be employed and/or manipulated to effectuate the purpose of forming the dielectric layer 708 with a specified internal stress that will increase the performance of the active device 102 by enhancing the carrier mobility within the channel 116. In other embodiments, the dielectric layer 708 may also include a stress memorization layer that transfers its stress to the active device 102 upon annealing.

In any case, the dielectric layer 708 can augment and/or enhance the compressive and/or tensile strain effects of the fourth layer 500, the first spacer 118, and/or the third spacer 704 upon the channel 116 of the active device 102.

It is to be understood that the specified internal stress within the dielectric layer 708 may be selected so as to efficiently produce a desired stress level within the channel 116 of the active device 102 in accordance with design and performance requirements of the integrated circuit system 100. By stress engineering the dielectric layer 708 with an appropriate stress, carrier mobility within the channel 116 of the active device 102 can be enhanced, thereby improving the performance of the integrated circuit system 100.

Moreover, it will be appreciated by those skilled in the art that the size and/or width of the first spacer 118 and the third spacer 704 can affect the performance of the active device 102 due to their ability to offset the dielectric layer 708 from the channel 116. Accordingly, the present embodiments permit the design engineer to configure the size and/or width of the first spacer 118 and the third spacer 704 to optimize the compressive or tensile stress of a subsequently deposited stressed inducing etch stop layer or stress inducing stress memorization layer upon the channel 116.

Subsequent to forming the source/drain extension 700, the optional halo region, the source/drain 702, and/or the dielectric layer 708, an anneal step can be performed to electrically activate the dopants and recrystallize the amorphous regions within the active device 102. It will be appreciated by those skilled in the art that the preceding implantation processes may have created a high degree of lattice damage within the active device 102. Accordingly, during the anneal process, the corresponding damaged and amorphous lattice portions can be re-grown resulting in a strained or stressed portion in the fourth layer 500 and in the island region 202. It will be appreciated by those skilled in the art that such a stress memorization transfer process can induce strain within the channel 116, thereby improving the carrier mobility of the integrated circuit system 100.

It is to be understood that the anneal of the present invention may include any thermal process that causes the amorphous and/or lattice damaged regions of the active device 102 to recrystallize under the stress of, and retain the stress of, the dielectric layer 708. As exemplary illustrations, the anneal may include a rapid thermal anneal, a spike anneal, a laser anneal, and/or a low temperature anneal followed by a laser based or flash based anneal.

As such, it has been discovered by the present inventors that the integrated circuit system 100 of the present invention facilitates the incorporation of both NFET and PFET channel stress, thereby improving the current carrying capability of the integrated circuit system 100.

Figure 8:
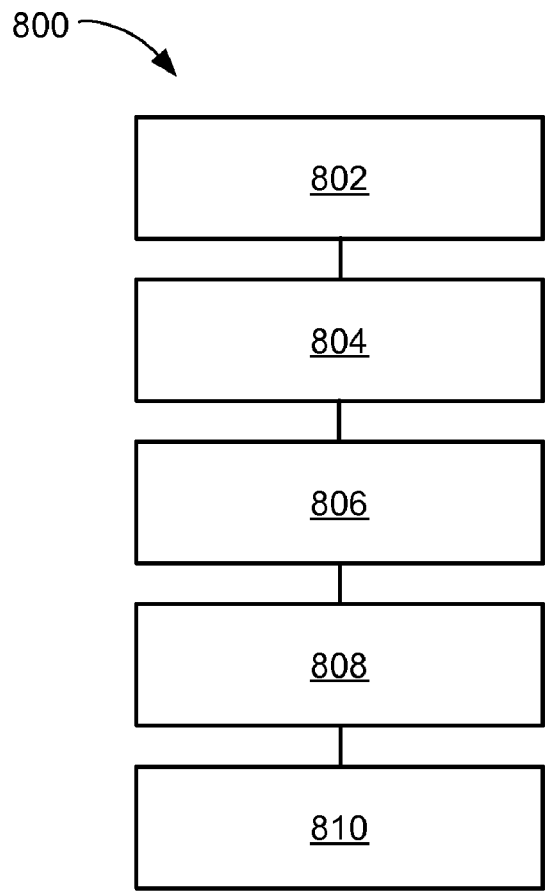
FIG. 8 is a flow chart of a method of manufacture of an integrated circuit system in an embodiment of the present invention.

Referring now to FIG. 8, therein is shown a flow chart of a method 800 of manufacture of the integrated circuit system 100 in an embodiment of the present invention. The method 800 includes: providing a second layer between a first layer and a third layer in a block 802; forming an active device over the third layer in a block 804; forming the third layer to form an island region underneath the active device in a block 806; forming the second layer to form a floating second layer with an undercut beneath the island region in a block 808; and depositing a fourth layer around the island region and the floating second layer in a block 810.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present invention thus has numerous aspects. One such aspect is that the present invention helps to reduce the external series resistance of an active device by eliminating a thin SOI layer and by forming an undercut or necking structure within a floating BOX layer formed underneath the active device.

Another aspect is that the present invention helps to control short channel effects within an active device by forming a floating BOX layer underneath the active device.

Another aspect is that the present invention helps to eliminate sidewall junction capacitance underneath the gate within an active device by forming a floating BOX layer underneath the active device.

Another aspect is that the present invention helps to eliminate self-heating problems common to prior SOI devices by forming a floating BOX layer surrounded by a region that permits thermal conduction.

Another aspect is that the present invention helps to prevent and/or improve latchup, parasitic capacitance, unwanted increases in electric fields, and hot carrier/electron effects.

Another aspect is that the present invention proposes a process flow that improves the manufacturability of an integrated circuit system employing a floating BOX layer by utilizing existing CMOS compatible equipment.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit system comprising:
   a substrate including a first layer;

a floating second layer with an undercut over the first layer;
an island region over the floating second layer;
an active device over the island region; and
a fourth layer around the island region and the floating second layer.

2. The system as claimed in claim 1 wherein:
the first layer and the island region include a semiconducting material.

3. The system as claimed in claim 1 wherein:
the first layer and the island region include a silicon material.

4. The system as claimed in claim 1 wherein:
the island region is on the floating second layer.

5. The system as claimed in claim 1 wherein:
the fourth layer includes an epitaxial material.

6. The system as claimed in claim 1 wherein:
the floating second layer includes an insulating material.

7. The system as claimed in claim 1 wherein:
the active device includes an MEET device, a PITT device, or a CMOS device.

8. The system as claimed in claim 1 wherein:
the fourth layer includes silicon-germanium or silicon.

9. The system as claimed in claim 1 wherein:
the floating second layer is on the first layer.

10. The system as claimed in claim 1 wherein:
the floating second layer alters self-heating of the active device.

* * * * *